United States Patent
Mohr et al.

(10) Patent No.: US 10,957,364 B2
(45) Date of Patent: Mar. 23, 2021

(54) CHARGE PUMP SUPPLY OPTIMIZATION AND NOISE REDUCTION METHOD FOR LOGIC SYSTEMS

(71) Applicant: Micron Technology, Inc., Boise, ID (US)

(72) Inventors: Christian N. Mohr, Allen, TX (US); John E. Riley, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 16/143,105

(22) Filed: Sep. 26, 2018

(65) Prior Publication Data

US 2020/0098398 A1 Mar. 26, 2020

(51) Int. Cl.
*G11C 5/14* (2006.01)
*H02M 3/07* (2006.01)

(52) U.S. Cl.
CPC .............. *G11C 5/145* (2013.01); *H02M 3/07* (2013.01)

(58) Field of Classification Search
CPC ......... G11C 5/145; G11C 7/02; G11C 29/021; H02M 3/07; H02M 2003/077
See application file for complete search history.

(56) References Cited

U.S. PATENT DOCUMENTS

| | | | | |
|---|---|---|---|---|
| 7,224,616 B2* | 5/2007 | Kim | ...................... | G11C 5/147 365/185.19 |
| 8,179,734 B2* | 5/2012 | Soma | ..................... | G11C 16/30 365/185.2 |
| 9,042,180 B2* | 5/2015 | Tanzawa | ................... | G06F 1/32 365/185.18 |
| 2007/0030052 A1* | 2/2007 | Kim | ....................... | H02M 3/07 327/536 |

* cited by examiner

*Primary Examiner* — Richard Elms
*Assistant Examiner* — R Lance Reidlinger
(74) *Attorney, Agent, or Firm* — Fletcher Yoder, P.C.

(57) ABSTRACT

Memory devices may have internal circuitry that employs voltages higher and/or lower than voltages provided by an external power source. Charge pumps are DC/DC converters that may be used to generate the higher voltages internally. The number of available charge pumps in a memory device may be conservatively dimensioned to be high, in some systems to protect yields. Some of the available charge pumps may be disabled during manufacturing or testing to reduce the number of active charge pumps. The testing process may employ dedicated logic in the memory device and the disabling may employ fuse circuitry.

11 Claims, 3 Drawing Sheets

CHARGE PUMP SUPPLY OPTIMIZATION AND NOISE REDUCTION METHOD FOR LOGIC SYSTEMS

BACKGROUND

1. Field of the Present Disclosure

This disclosure relates to memory devices, and more specifically, to charge pump supply circuitry in memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage during data processing operations. To that end, these memory devices may have addressable memory elements arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through an internal data path that may include circuitry for reading or writing data bits in the memory elements.

Several operations in the memory device may employ voltages that may be higher and/or lower than the power supply voltages of the memory device. For example, certain memory devices may be coupled to a power supply with a voltage of about 1.2V and/or about 2.5V, and may have certain operations that employ voltages in a range such as above 2.5V and/or below 0V. To perform such operations, charge pump power supplies, may be employed to provide higher voltages. More generally, charge pumps may be voltage generators that may provide voltages larger than input voltages. As the current and voltage demands of memory devices increase with memory density and memory speed, improvements in the charge pump technology may allow for systems with reduced power consumption and/or improved reliability.

BRIEF DESCRIPTION OF THE DRAWINGS

Various aspects of this disclosure may be better understood upon reading the following detailed description and upon reference to the drawings in which.

DETAILED DESCRIPTION

Figure 1:
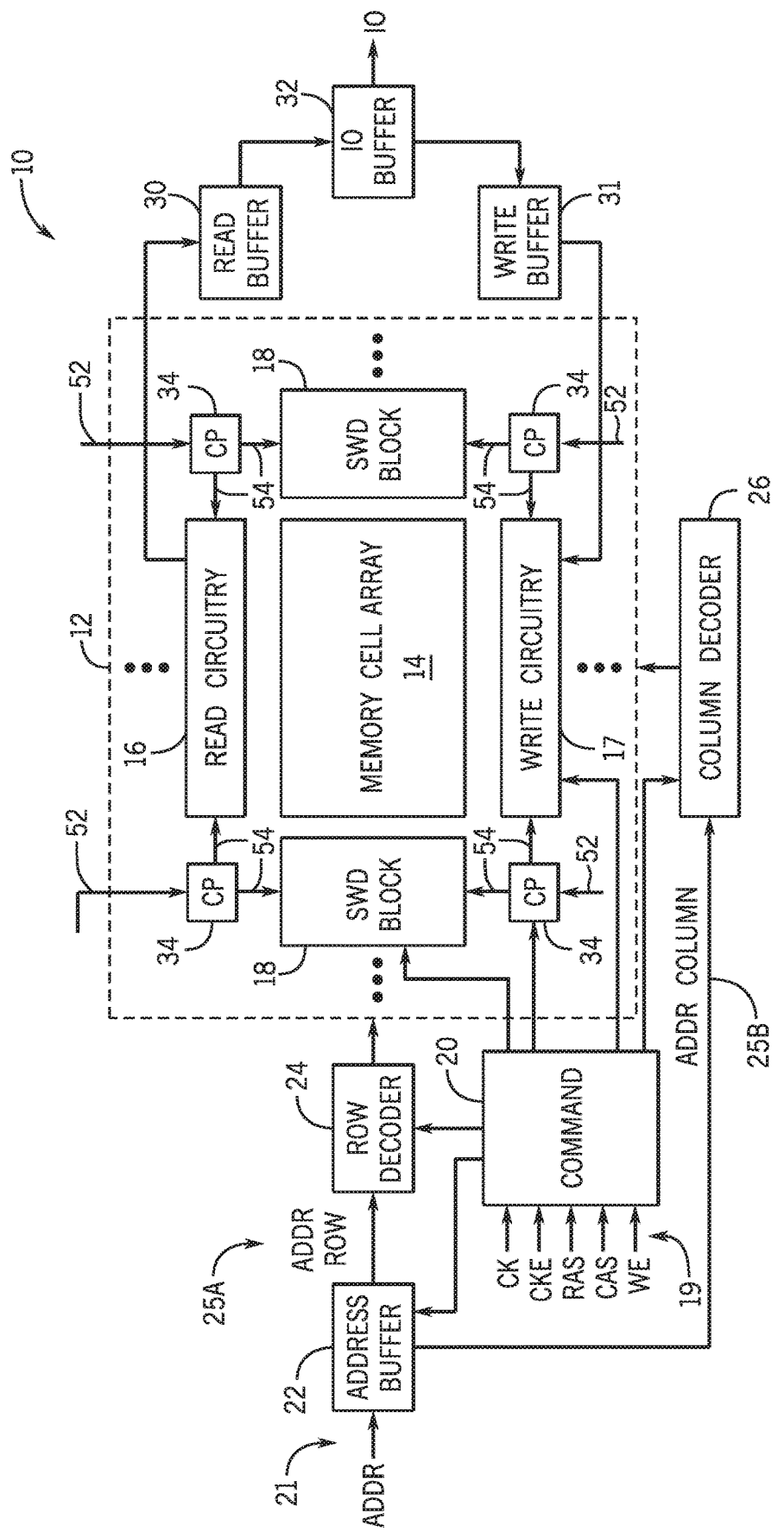
FIG. 1 is a block diagram of a memory device with a configurable number of enabled charge pumps, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may store data using addressable memory elements (e.g., memory rows or columns), which may be disposed in memory banks. Examples of addressable memory devices include random access memory (RAM) devices, dynamic RAM (DRAM) devices such as synchronous DRAM (SDRAM) devices, double data rate SDRAM devices (e.g., DDR SDRAM, DDR2 SDRAM, DDR3 SDRAM, DDR4 SDRAM), and graphics DDR SDRAM devices (e.g., GDDR3 SDRAM, GDDR4 SDRAM), as well as static RAM (SRAM) devices, and/or flash memory devices, among others.

Processing circuitry in the electronic systems may access (e.g., read/write) the memory elements by interacting with an input/output (I/O) interface and a command interface. As an example, a processor may store information by providing a write command and/or an address for a memory element, and read stored information from a particular memory element from the memory device by providing a read command and/or an address. The commands and/or addresses may be provided via the command interface, and the requested information (e.g., data bits) may be retrieved via the I/O interface.

The power to perform memory operations, such as read, write, or refresh operations, may be obtained from power supply connections (e.g., power supply ($V_{DD}$), activating power supply ($V_{PP}$), ground supply ($V_{SS}$)) with the electronic device. For example, the memory device may have external connections (e.g., pins) associated with power supply connections, which may be coupled to pins in a socket of a printed circuit board (e.g., a motherboard). The voltages and tolerances of the power supply connection may be specified in a standard for the memory device. For example, DDR4 may include a $V_{DD}$ specification of about 1.2V and a $V_{PP}$ specification of about 2.5V. However, certain operations within the memory device may benefit from a higher and/or lower voltage (e.g., above 2.5V and/or below 0V). To that end, the memory devices may include analog power supplies, such as charge pumps and/or charge pump cores, which may be DC/DC converters that generate higher voltages from the voltages provided by the power supply lines.

Charge pumps may, in general, generate voltage increases by employing a switching device (e.g., a transistor) or by switching to controls connections across energy storage devices (e.g., a capacitor). Based on, among other things, the switching frequency, the duty cycle of the switching signal, and the input voltages, a target output voltage and/or the current capacity of the charge pump may be adjusted. Operation of charge pumps may demand substantial currents during short periods of time, to charge the energy storage devices. As a result, operation of charge pumps may cause interference with other circuitry in the memory devices.

Examples of such interference include current drop noise ($I_R$ drop noise), which may be caused by the competition for electrical power during due to the large currents used by the charge pump.

Memory devices may include several charge pumps. The number of charge pumps in memory devices may be dimensioned based on worst-case scenarios, to obtain a large production yield. For example, the number of charge pumps in a memory device may be the determined based on a simulation of the most power demanding operation (e.g., a refresh operation, which may activate all memory cells of a memory device). A worst-case scenario simulation may also assume that the charge pump performs with the lowest capacity within the tolerance margin. As a result of the use of worse-case scenarios during simulation, the number of charge pumps in a memory device may be larger than needed for good operation of an average memory device. The resulting number may be conservative to obtain a large yield.

As the size of memory devices increases and the number of on-die memory increases (e.g., 8 Gb, 16 Gb, 32 Gb per memory die), the number charge pumps in the die may become large. Due to the impact on the operation of the devices, a reduction in the number of charge pumps during operation may improve the performance of the memory device. Embodiments described herein are related to methods and systems capable of adjusting the number of active charge pumps in the memory device. To that end, the memory device may include testing circuitry (e.g., testing logic) to test and/or verify the performance of the available charge pumps and to identify the number of charge pumps that may be enabled or disabled. Moreover, the memory device may include switching or fuse circuitry to program the number of charge pumps to be used. Programming of the fuses may be performed based on results from the testing operation. The use of the programmable circuitry may allow high production yields, as all memory devices satisfy performance specifications in worst-case scenarios, and reduced noise (e.g., current drop noise), as the number of active pumps may be reduced during production.

With the foregoing in mind, FIG. 1 is a block diagram of a memory device 10 in accordance with an embodiment of the present invention. The memory device 10 may have one or more memory banks 12, which may include one or more memory cell arrays 14. Each memory cell array 14 may be coupled to read circuitry, such as one or more read blocks 16 (e.g., sense amplify circuitry) that may facilitate read operations and write circuitry, such as write blocks 17 that may facilitate write operations. In some embodiments, a single block may be used to perform part or all of the functions performed by the read blocks 16 and the write blocks 17. Read blocks 16 and/or write blocks 17 may operate by amplifying and coordinating local input/output (I/O) lines coupled to the memory cell array 14. The memory cell array 14 may also be coupled to subword driver (SWD) blocks 18. The SWD blocks 18 may facilitate read and write operations by providing voltage that may activate memory rows or memory columns in the memory cell array 14. Charge pumps 34 may be disposed near memory banks 12 to provide an electrical signal the read blocks 16, write blocks 17, and/or the SWD blocks 18. Moreover, charge pumps 34 may receive one or more electrical power signals 52 (e.g., $V_{DD}$, $V_{PP}$, $V_{SS}$).

The logic blocks in the memory banks 12 may be controlled by clock and/or command signals 19, which may be received by a command block 20. Command block 20 may decode the clock and/or command signals 19 to generate various internal signals to control internal data circuitry, such as address buffers 22, decoders such as row decoder 24 and column decoder 26, read buffer 30, write buffer 31, charge pumps 34, and/or input/output (I/O) buffer 32. For example, when an operation demands a high voltage signal 54 from the charge pumps 34, the command block 20 may provide instructions to activate the charge pumps 34 and provide the high voltage signal 54 based on the device power signals 52. In order to address data, the address buffer 22 may receive address signal 23. The clock and/or command signals 19 and the address signal 23 may be provided by processing circuitry coupled to the memory device, as discussed above.

In order to manipulate data at an address, an external device may also provide an address signal 21, in addition to the clock and/or command signals 19. The address signal 21 may be decoded in the address buffer 22 into a row address 25A and column address 25B. The row address 25A may be provided to a row decoder 24 and the column address 25B may be provided to a column decoder 26. The row decoder 24 and the column decoder 26 may be used to control the appropriate SWD block 18 to activate the memory cells associated with the requested address signal 21.

For example, in a read operation, the memory cells associated with the row address 25A and the column address 25B may be activated by a SWD block 18, the read block 16 may generate a data read signal, and read buffer 30 and I/O buffer 32 may amplify and transport the read data to an external device. During a write operation, the memory cells associated with the row address 25A and the column address 25B may be activated by the SWD block 18, the I/O buffer 32 may latch the incoming data from the external device, and the write buffer 31 and the write block 17 may store the read data to an external device. Other operations may also be performed, such as refresh operation that refreshes the data in the entire memory device. In the refresh operation, the SWD block 18 may activate all rows in the memory cell array 14 to avoid data loss. In the processes related with these operations, the charge pumps 34 may be activated and/or de-activated to provide adequate voltages, as discussed above.

Figure 2:
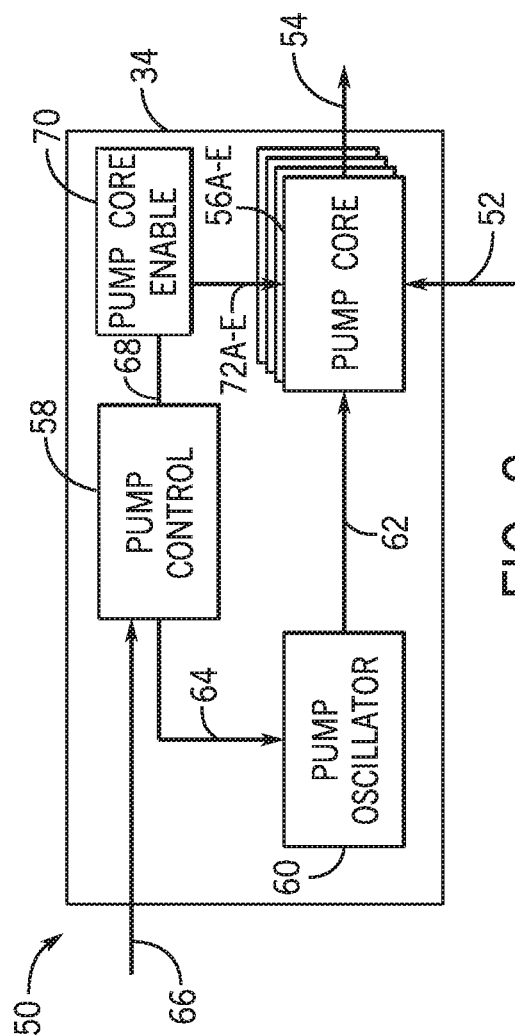
FIG. 2 is a block diagram of a programmable charge pump circuit that may include an enable/disable fuse, in accordance with an embodiment.

FIG. 2 illustrates a block diagram 50 of a charge pump 34, which may enabled or disabled, as discussed herein. The block diagram 50 is provided to illustrate general functionality of a charge pump 34, and it is understood that the methods and systems described herein may be adjusted and/or applied to other charge pump systems. As discussed above, the charge pump 34 may operate as a DC/DC converter that receives one or more input power signals 52 and may provide an output electrical signal 54 with a higher voltage. To that end, the charge pump 34 may have one or more pump cores 56A-E, which may include switching circuitry and energy storage circuitry. The switching circuitry may include, for example, transistors and/or diodes and the energy storage circuitry may include, for example, capacitors.

Charge pump 34 may also include a pump controller 58 and/or a pump oscillator 60. The pump oscillator 60 may provide a signal 62 that regulates the operation of the pump cores 56A-E. Of note, the frequency and/or the duty cycle from the signal 62 may be controlled to change the voltage level and/or the available current of the output electrical signal 54. The pump controller 58 may be coupled to sensors (e.g., voltage sensors, feedback circuitry) that monitor the output electrical signal 54 of the pump cores 56A-E and adjust the operation of the pump oscillator 60 accordingly. For example, if the current demands on the pump cores 56A-E cause a voltage drop in the output electrical signal 54, the pump oscillator 60 may increase its frequency.

The charge pump 34 may also receive a control signal 66 from a memory device controller (e.g., command block 20) to enable, disable, or adjust a mode of the charge pump cores 56A-E. The pump controller 58 may receive the control signal 66 to enable charge pumps using an activating signal 68. A pump core enable logic 70, may process the control signal 68 to provide one or more enable signals 72 to the pump cores 56A-E. The pump core enable logic 70 may include one or more fuses or anti-fuses that may be used to program the charge pump 34 and/or individual pump cores 56A-E. As discussed herein, a fuse may be a programmable switch that is designed to break (i.e., open) a circuit path permanently upon the application of a voltage and/or a current that exceeds a threshold level. Alternatively, the fuse may be a resettable fuse that can be opened, but later reset (i.e., closed). An anti-fuse may be a programmable switch that is designed to close a circuit path upon the application of a voltage and/or a current that exceeds a threshold level. Fuses can be programmed during the device characterization, detailed in FIG. 4, to control the number of enabled pump cores.

Figure 3:
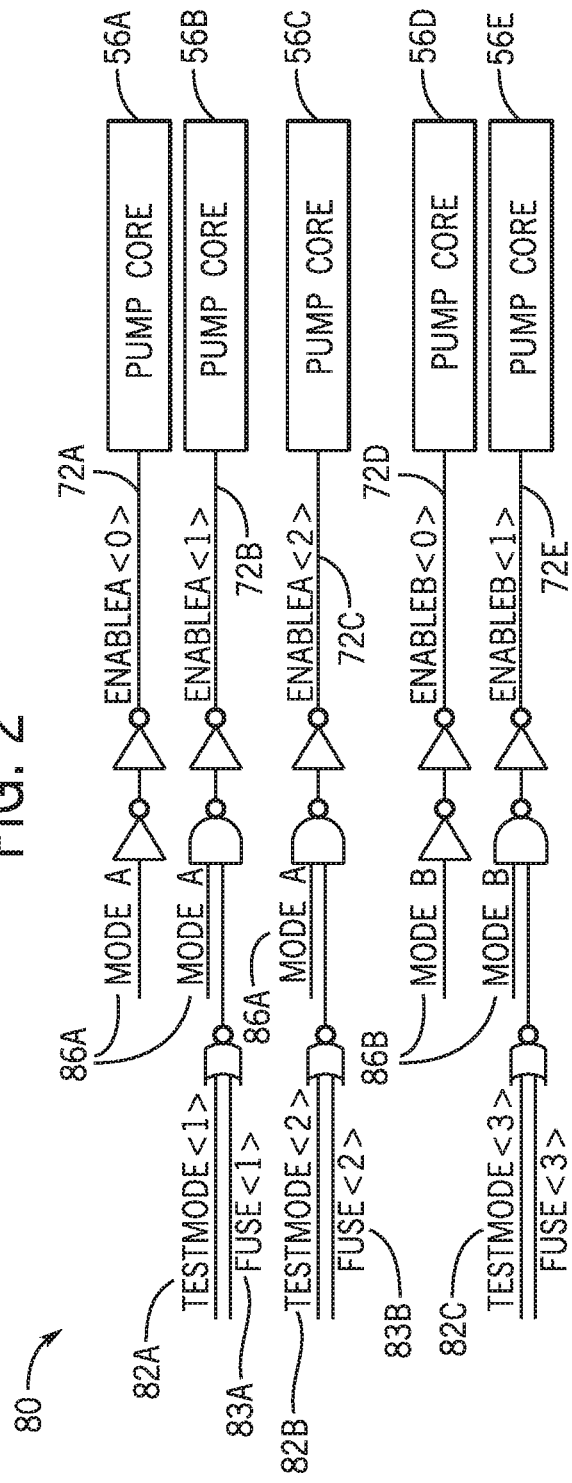
FIG. 3 is schematic diagram of charge pump circuitry in a memory device for configuring charge pumps and/or charge pump cores, in accordance with an embodiment.

Schematic diagram 80 of FIG. 3 illustrates a logical diagram for operations that may be performed in the pump core enable logic 70 during operation of the charge pumps 34 in a memory die. As discussed above, the charge pumps 34 and/or the pump cores 56A-E may be enabled or disabled during a testing operation, to verify an optimal number of active charge pumps 34 and/or pump cores 56A-E. As discussed herein, an optimal number of active charge pumps 34 and/or pump cores 56A-E may refer to a minimum number of active charge pump devices that provide sufficient charge (e.g., electrical current) to the memory device. In the diagram 80, signals generated during a testing operation are represented by testmode signals 82A, 82B, and 82C Following and/or during the testing operation, programming of the charge pumps 34 and/or pump cores 56A-E may be performed with the use of fuse circuitry (e.g., fuses, antifuses, switches) in pump core enable logic 70. The pump core enable logic 70 may disable charge pumps 34 and/or pump cores 56A-E during operation by blocking enable signals (e.g., control signal 66, activating signal 68). In the diagram 80, signals associated with fuses of the pump core enable logic 70 may be represented by fuse signals 83A, 83B, and 83C.

In the diagram 80, the pump core enable logic 70 controls charge pump cores 56A, 56B, 56C, 56D, and 56E with activating signals 72A, 72B, 72C, 72D, and 72E, respectively. The activating signals 72A, 72B, 72C, 72D, and 72E may be generated based on a particular mode and/or operation. As discussed above, charge pumps 34 and/or pump cores 56A-E may be enabled based on an operation that is being performed and/or in preparation of an operation that is soon to be performed. The operation may be associated with a charge pump configuration mode. Each charge pump configuration mode may be associated with a mode signal, such as mode A signal 86A and/or mode B signal 86B. As an example, a write operation may be associated with mode A (e.g., activates signal 86A), a read operation may be associated with mode B (e.g., activates mode B signal 86B), and a refresh operation may be associated with both modes A and B (e.g., activates signal 86A and 86B).

Circuitry in the pump core enable logic 70, represented in diagram 80, may allow gating of mode signals (e.g., mode A signal 86A and mode B signal 86B) based on a testmode signal (e.g., testmode signals 82A, 82B, 82C) or a fuse signal (e.g., fuse signals 83A, 83B, 83C). For example, mode A signal 86A, that may be used to activate pump cores 56A, 56B and 56C, may be selectively gated by either testmode signal 82A or fuse signal 83A in the activation of pump core 56B. The activation of pump core 56C may be based on the mode A signal 86A as gated by testmode signal 82B or fuse signal 83B. Similarly, mode B signal 86B may be selectively gated by either testmode signal 82C or fuse signal 83C. As such, pump core enable logic 70 may selectively enable pump cores 56B, 56C, or 56E during testing with testmode signals 82A, 82B, and 83C. In view of the testing results, fuses associated with fuse signals 83A, 83B, and 83C may be programmed accordingly.

Figure 4:
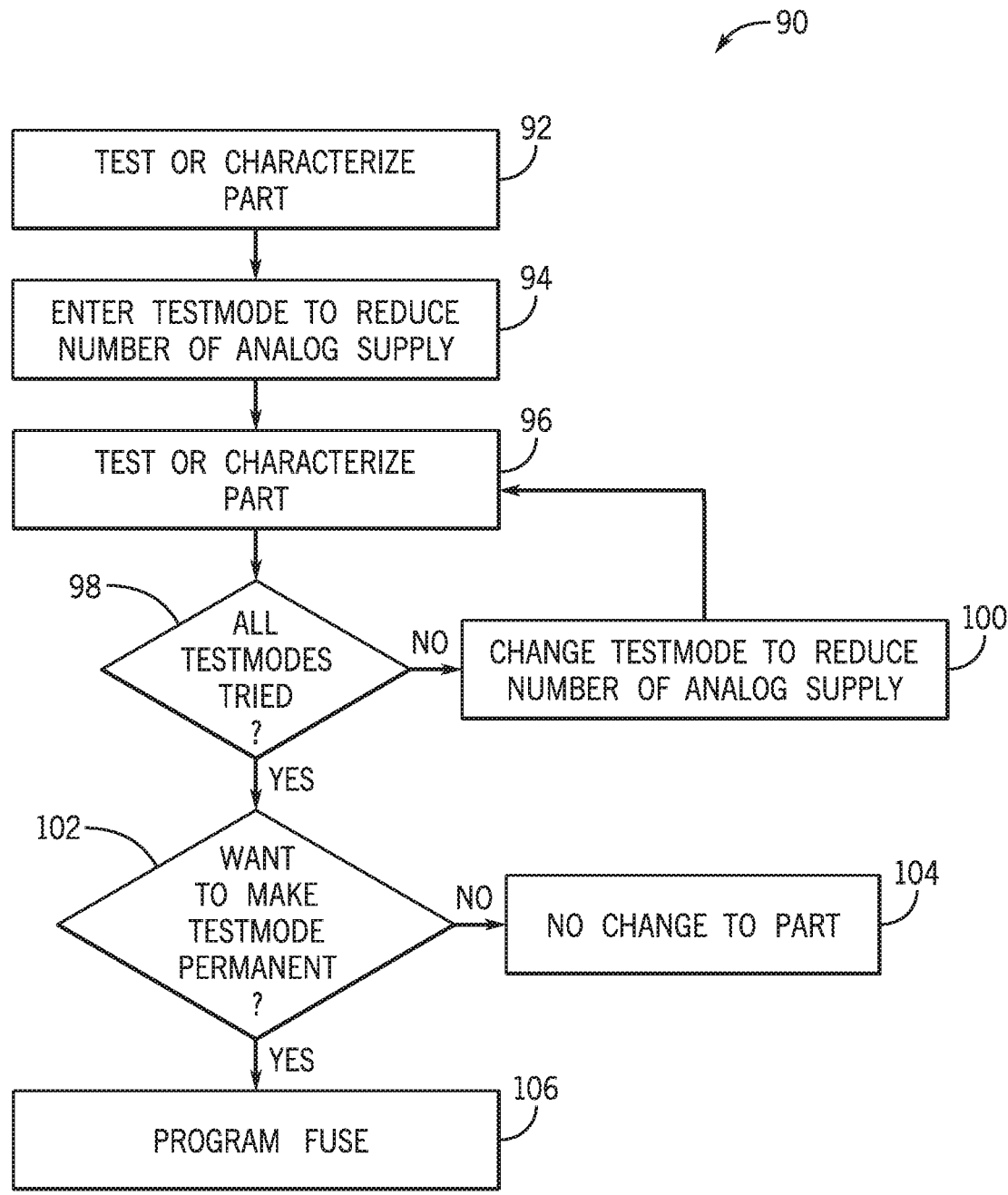
FIG. 4 is a flow chart illustrating a method to enable and/or disable charge pumps during testing of a memory device, in accordance with an embodiment.

As discussed above, the memory devices may have charge pump fuses programmed during a testing and/or a quality control process. The method 90 of FIG. 4 illustrates a calibration process that may be used to program charge pump fuses in a memory device. Method 90 may be begin in a part testing block 92, that may test the part performance prior to the selective disabling of charge pumps. The performance may be stored for later comparison.

Method 90 may enter an iterative process with a part testing block 96, a decision block 98, and a mode testing block 100 for selective disabling of charge pumps. The decision block 98 may be used to determine if all testmode signals (e.g., testmode signals 82A, 82B, 82C of FIG. 3) were tested. While there are testmode signals that were not tested, the process may perform, in block 100, an adjustment to the testmode signals to reduce the number of charge pumps and, in block 96, testing of the of the performance after the adjustment performed in block 100. The testing performed in block 96 may include, for example, a direct testing of the power supplies that (e.g., testing voltage signals, testing currents, testing available charge from charge pumps) or an indirect testing (e.g., satisfaction of timing specifications for operations that employ charge pumps).

Once all testmodes are tested, method 90 may proceed from the decision block 98 to the decision block 102. In decision block 102, based on the results of the several tests in decision block 98, a decision on disabling the charge pumps may be taken. If the charge pumps are to remain enabled, the fuses are not programmed in block 104. If the changes tested using the testmode signals are to be implemented, the associated fuses may be programmed in block 106. Generally, the decision may be made automatically based on the memory device metrics collected during testing. The metrics for the memory device (e.g., voltage signals, current signals, current drops, timing) may be used to determine whether the charge pump is redundant, and if it should be disabled or enabled by breaking a fuse or closing an antifuse.

The method 90 may be a fully automated method. To that end, dedicated testing hardware and software may be employed. The hardware may have connectors and/or sockets to receive the memory device under test and may be capable of generating the testmode signals and fuse programming signals. The software may be configured to communicate with the memory device under test through the testing hardware to generate the testmodes available, collect testing results, and/or compare testing results with previous results, to perform decisions related to the performance, and to program the fuse.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
   a plurality of memory cells;
   first circuitry configured to perform a first memory operation of a plurality of memory operations;
   a charge pump configured to receive a first voltage and to generate a second voltage higher than the first voltage, wherein the second voltage is configured to power the first circuitry during performance of the first memory operation;
   fuse circuitry comprising a first switch configured to enable the charge pump or disable the charge pump; and
   logic circuitry configured to receive a testmode signal, wherein the testmode signal is associated with:
      generating an enable signal associated with the charge pump based on the testmode signal; and
      disabling the charge pump of the memory device to test the first memory operation to obtain a memory device metric, wherein the memory device metric includes a timing specification.

2. The memory device of claim 1, wherein the first switch comprises a fuse configured to disable the charge pump when the fuse is broken.

3. The memory device of claim 1, wherein the first switch comprises an anti-fuse configured to enable the charge pump when an anti-fuse circuit path is closed.

4. The memory device of claim 1, wherein the plurality of memory operations comprises a read operation, a write operation, or a refresh operation.

5. The memory device of claim 1, wherein the first voltage comprises an activating power supply voltage ($V_{PP}$) or a power supply voltage ($V_{DD}$).

6. The memory device of claim 1, comprising a second charge pump configured to receive the first voltage and to generate the second voltage, and wherein the fuse circuitry comprises a second switch configured to enable the second charge pump or disable the second charge pump.

7. The memory device of claim 1, comprising logic circuitry configured to receive a fuse signal from the fuse circuitry and a testmode circuitry from testing hardware coupled to the memory device, and configured to receive a testmode signal associated with the charge pump to enable the charge pump or disable the charge pump based on the testmode signal.

8. A method for manufacturing a memory device, comprising:
   disabling a first analog power supply of the memory device using a first testmode signal;
   testing a first memory operation in the memory device with the disabled first analog power supply to obtain a memory device metric, wherein the memory device metric includes a timing specification;
   disabling the first analog power supply using a first fuse associated with the first analog power supply based on the memory device metric.

9. The method of claim 8, comprising:
   disabling a second analog power supply using a second testmode signal;
   testing a first memory operation in the memory device with the disabled second analog power supply to obtain the memory device metric; and
   disabling the second analog power supply using a second fuse associated with the second analog power supply based on the memory device metric.

10. The method of claim 8, wherein the first analog power supply comprises a charge pump or a charge pump core.

11. The method of claim 8, wherein the first memory operation comprises a refresh operation.

* * * * *